US008289811B2

(12) United States Patent
Mitchell et al.

(10) Patent No.: US 8,289,811 B2
(45) Date of Patent: Oct. 16, 2012

(54) SYSTEM AND METHOD FOR DETERMINING LOCATION OF SUBMERGED SUBMERSIBLE VEHICLE

(75) Inventors: James B. Mitchell, Sykesville, MD (US); Bliss G. Carkhuff, Laurel, MD (US); Morris L. London, Annapolis, MD (US); Robert E. Ball, Pasadena, MD (US); Nathaniel J. Hundley, Joppa, MD (US)

(73) Assignee: The Johns Hopkins University, Baltimore, MD (US)

( * ) Notice: Subject to any disclaimer, the term of this patent is extended or adjusted under 35 U.S.C. 154(b) by 250 days.

(21) Appl. No.: 12/551,649

(22) Filed: Sep. 1, 2009

(65) Prior Publication Data

US 2011/0051555 A1    Mar. 3, 2011

(51) Int. Cl.
G01S 3/80 (2006.01)
G01S 15/00 (2006.01)
(52) U.S. Cl. .......................................... 367/127; 367/99
(58) Field of Classification Search ...................... 367/99
See application file for complete search history.

(56) References Cited

U.S. PATENT DOCUMENTS

| 3,668,617 A | 6/1972 | Brainard, II |
| 3,805,164 A | 4/1974 | Callaway |
| 4,416,023 A | 11/1983 | Michoff |
| 4,760,348 A | 7/1988 | Pease et al. |
| 4,774,519 A | 9/1988 | Pease et al. |
| 4,857,865 A | 8/1989 | Berman et al. |
| 5,068,918 A | 11/1991 | Verheijen et al. |
| 5,483,209 A | 1/1996 | Takayama |
| 5,999,568 A | 12/1999 | Yiu |
| 6,137,354 A | 10/2000 | Dacus et al. |
| 6,504,435 B1 | 1/2003 | Martins |
| 6,678,512 B1 | 1/2004 | Kaminski et al. |
| 6,831,572 B2 * | 12/2004 | Strumolo et al. ............. 340/903 |

(Continued)

OTHER PUBLICATIONS

Ying Shijun; Chen Jinbiao; Shi Chaojian; , "A Data Fusion Algorithm for Marine Radar Tracking," Intelligent Systems, 2009. GCIS '09. WRI Global Congress on , vol. 1, pp. 234-238, May 19-21, 2009.*

(Continued)

*Primary Examiner* — Isam Alsomiri
*Assistant Examiner* — James Hulka
(74) *Attorney, Agent, or Firm* — Noah J. Hayward

(57) ABSTRACT

An aspect of the present invention is drawn to method of determining a location of a submersible vehicle. The method includes obtaining first bearing information based on a location of a ship at a first time relative to the submersible vehicle and receiving broadcast information from the ship, wherein the broadcast information includes location information related to a second location of the ship at a second time, a velocity of the ship at the second time and a course of the ship at the second time. The method further includes obtaining second bearing information based on the second location of the ship at the second time relative to the submersible vehicle, obtaining a velocity of the submersible vehicle at the second time and obtaining a course of the submersible vehicle at the second time. The method still further includes determining the location of the submersible vehicle based on the first bearing information, the second location of the ship at the second time, the velocity of the ship at the second time, the course of the ship at the second time, the second bearing information, the velocity of the submersible vehicle at the second time and the course of the submersible vehicle at the second time.

1 Claim, 6 Drawing Sheets

U.S. PATENT DOCUMENTS

| | | |
|---|---|---|
| 6,861,910 B2 | 3/2005 | Karasudani |
| 7,106,149 B2 | 9/2006 | Selz |
| 7,362,384 B2 | 4/2008 | Dauphinee et al. |
| 7,526,043 B2 | 4/2009 | Lim et al. |
| 2003/0020558 A1 | 1/2003 | Tiihonen et al. |
| 2004/0165479 A1 | 8/2004 | Scoca et al. |
| 2004/0184351 A1* | 9/2004 | Nishimori et al. ............ 367/103 |
| 2005/0041102 A1* | 2/2005 | Bongiovanni et al. ........ 348/155 |
| 2006/0056273 A1* | 3/2006 | Scoca et al. ..................... 367/99 |
| 2007/0058487 A1* | 3/2007 | Audi et al. ...................... 367/11 |
| 2007/0058488 A1* | 3/2007 | Lerro et al. ..................... 367/99 |
| 2008/0043574 A1* | 2/2008 | Rooney et al. ................. 367/87 |
| 2008/0310480 A1 | 12/2008 | Maiuzzo |
| 2010/0220551 A1* | 9/2010 | Akiyama et al. ............... 367/99 |

OTHER PUBLICATIONS

Pease, Brian L., "VLF-VHF Broadband in Line Amplifier for Submarine Antennas", H1220, Aug. 3, 2009, pp. 1-5.

* cited by examiner

SYSTEM AND METHOD FOR DETERMINING LOCATION OF SUBMERGED SUBMERSIBLE VEHICLE

STATEMENT OF GOVERNMENTAL INTEREST

This invention was made with U.S. Government support under the Naval Sea Systems Command, contract number N00024-04-D-8601. The U.S. Government has certain rights in the invention.

BACKGROUND

The present invention is drawn to an amplifier and a processing system enabling a submersible vehicle to accurately determine its location.

Conventional methods employed by submersible vehicles to determine their location when submerged are prone to inaccuracies or unreliable. More accurate methods used when on the surface are not available when submerged below periscope depth.

One conventional method submersible vehicles use for determining their location is with inertial guidance systems. Inertial guidance systems operate by monitoring acceleration and changes in rotational attributes like pitch, roll and yaw. This data along with the submersible vehicle's speed is processed by a computer to determine the current position of the submersible vehicle. Unfortunately, inertial guidance systems suffer from accumulated error. Any errors in measurement of the rotational attributes are accumulated. With enough error accumulation, the total error can become significant enough to cause safety issues as the operators of the submersible vehicle think they are at a particular location, but are actually at a very different location.

Submersible vehicles have several other methods for navigation including sonar, radar, radio and Global Positioning System (GPS). Each of these methods has limitations with respect to their use. Submersible vehicles may operate in stealth mode wherein active sonar and radar methods of navigation may not be used because such methods may enable outside observers to determine the location of the submersible vehicle. Submersible vehicles can determine their location with radio navigation and a GPS, however both of these methods require the submersible vehicle to operate at periscope depth and extend an antenna above the surface of the body of water.

FIG. 1A illustrates a conventional method in which a submersible vehicle is able to determine its location using a GPS.

FIG. 1A includes a submersible vehicle 100 under the sea surface 102 within an undersea region 116. Submersible vehicle 100 includes a periscope 104 and an antenna 106. A GPS satellite 108 provides a radio signal 110, whereas a GPS satellite 112 provides a radio signal 114.

The majority of submersible vehicle 100 is located in undersea region 116. Periscope 104 and antenna 106 extend above the upper region of submersible vehicle 100. When submersible vehicle 100 is at periscope depth, as illustrated in FIG. 1A, it is able to use periscope 104 by extending it above sea surface 102. Submersible vehicle 100 uses periscope 104 to view objects located on or adjacent to sea surface 102. At periscope depth, submersible vehicle 100 is able to extend antenna 106 above sea surface 102. When antenna 106 is extended above sea surface 102, antenna 106 is able to receive radio signal 110 and radio signal 114. GPS satellite 108 and GPS satellite 112 are located in orbit above the earth. Submersible vehicle 100 is able to process radio signal 110, and radio signal 114 to determine its location.

FIG. 1B illustrates submersible vehicle 100 when it is below periscope depth and is not able to determine its location using a GPS.

As illustrated in FIG. 1B, submersible vehicle 100 is fully submerged beneath sea surface 102. Antenna 106 is positioned beneath sea surface 102 and is located in undersea region 116. Due to their high frequencies, radio signal 110 and radio signal 114 are not able to penetrate into undersea region 116, where antenna 106 is located. Submersible vehicle 100 is not able to receive radio signal 110 and radio signal 114 and is not able to determine its location.

A conventional method for a submersible vehicle to determine its position, while below periscope depth, using GPS satellites will now be described with reference to FIG. 2.

FIG. 2 illustrates a conventional method for a submersible vehicle to determine its location using a GPS and a buoyant cable antenna (BCA).

FIG. 2 includes submersible vehicle 100 under the sea surface 102 within an undersea region 116. Submersible vehicle 100 includes has a BCA 202 attached thereto. BCA 202 includes a buoyant transmission cable portion 204 and an inline amplifier 206, and a buoyant antenna portion 203. GPS satellite 108 provides radio signal 110, whereas GPS satellite 112 provides radio signal 114.

As illustrated in FIG. 2, submersible vehicle 100 is fully submerged with antenna 106 and periscope 104 located in undersea region 116. As described previously and illustrated in FIG. 1B, antenna 106 is not able to receive GPS radio signals 110 and 114. As a result, submersible vehicle 100 is unable to determine is location with a GPS using antenna 106.

However, the buoyant antenna portion 203 of BCA 202 floats on sea surface 102 while the other end is connected to submersible vehicle 100. Since buoyant antenna portion 203 floats on top of sea surface 102, it is able to receive radio signal 110 and radio signal 114. Radio signal 110 and radio signal 114 would be conveyed from BCA 202 to submersible vehicle 100. Inline amplifier 206 would be required to amplify radio signal 110 and radio signal 114 to account for losses while traveling along buoyant transmission cable portion 204. Submersible vehicle 100 receives the amplified version of radio signal 110 and radio signal 114. Submersible vehicle 100 uses the amplified version of radio signal 110 and radio signal 114 to determine its location with a GPS. However two problems still exist with this method.

The above described method determines the location of buoyant antenna portion 203. Only an approximate location of submersible vehicle 100 is determined as a result of the distance between an end of BCA 202 and submersible vehicle 100 as denoted by a separation distance 210.

A second problem with the above method is that conventional inline amplifier 206 is not capable of providing sufficient amplification of radio signal 110 and radio signal 114 to reach the interior of submersible vehicle 100 with sufficient strength to be used to determine a position.

An example conventional inline amplifier 206 will now be described with reference to FIG. 3.

As illustrated in FIG. 3, inline amplifier 206 includes a filter 300, an amplifier 302, a gain compensation filter 304, an amplifier 306 and a filter 308.

Filter 300 is arranged to receive an input signal 310 and output a filtered signal 312. Amplifier 302 is arranged to receive filtered signal 312 and output an amplified signal 314. Gain compensation filter 304 is arranged to receive amplified signal 314 and output a compensated signal 316. Amplifier 306 is arranged to receive compensated signal 316 and output an amplified signal 318. Filter 308 is arranged to receive amplified signal 318 and output an output signal 320.

In operation, the end of BCA 202 receives a signal, for example from GPS satellite 108. The signal is transmitted along buoyant transmission cable portion 204 until it is amplified by inline amplifier 206. Specifically, filter 300 receives input signal 310 and passes a portion of input signal 310 that is within a predetermined frequency band(s) of interest and attenuates the remaining portions of input signal 310.

Amplifier 302 amplifies filtered signal 312.

Gain compensation filter 304 compensates for the signal attenuation characteristics of the transmission cable connected between output of inline amplifier 206 and submersible vehicle 200. Specifically, gain compensation filter 304 has a transfer function that provides an incremental increase in amplification for a predetermined portion of amplified signal 314.

Amplifier 306 amplifies compensated signal 316.

Filter 308 receives passes a portion of amplified signal 318 that is within a predetermined frequency band(s) of interest and attenuates the remaining portions of amplified signal 318.

As discussed above, even if BCA 202 is able to transmit received GPS signals to submersible vehicle 100, submersible vehicle 100 may not accurately determine its location as a result of the unknown position of buoyant antenna portion 203 relative to submersible vehicle 100.

What is needed is a system and method for a submersible vehicle to accurately determine its location when submerged.

BRIEF SUMMARY

It is an object of the present invention to provide a system and method for a submersible vehicle to accurately determine its location when submerged.

An aspect of the present invention is drawn to method of determining a location of a submersible vehicle. The method includes obtaining first bearing information based on a location of a ship at a first time relative to the submersible vehicle and receiving broadcast information from the ship, wherein the broadcast information includes location information related to a second location of the ship at a second time, a velocity of the ship at the second time and a course of the ship at the second time. The method further includes obtaining second bearing information based on the second location of the ship at the second time relative to the submersible vehicle, obtaining a velocity of the submersible vehicle at the second time and obtaining a course of the submersible vehicle at the second time. The method still further includes determining the location of the submersible vehicle based on the first bearing information, the second location of the ship at the second time, the velocity of the ship at the second time, the course of the ship at the second time, the second bearing information, the velocity of the submersible vehicle at the second time and the course of the submersible vehicle at the second time.

Another aspect of the present invention is drawn to another method of determining a location of a submersible vehicle. The method includes receiving first broadcast information from a first ship, wherein the first broadcast information includes first location information related to a location of the first ship. The method additionally includes receiving second broadcast information from a second ship, wherein the second broadcast information includes second location information related to a location of the second ship. Further, the method includes obtaining first bearing information based on the location of the first ship relative to the submersible vehicle and obtaining second bearing information based on the location of the second ship relative to the submersible vehicle. Still further, the method includes determining the location of the submersible vehicle based on the first broadcast information, the second broadcast information, the first bearing information and the second bearing information.

Yet another aspect of the present invention is drawn to an amplifier for use in a buoyant cable antenna operable to receive signals within a frequency band. The amplifier includes a first amplifier, a bandpass filter, an attenuator and a second amplifier. The first amplifier can provide amplified signals based on the received signals. The bandpass filter is arranged to pass filtered signals within a first portion of the frequency band, wherein the filtered signals are based on the amplified signals. The attenuator is arranged in parallel with the bandpass filter and is operable to attenuate signals within a second portion of the frequency band, wherein the attenuated signals are based on the amplified signals. The second amplifier can provide an amplified output including first amplified signals within the first portion of the frequency band and can second amplified signals within the second portion of the frequency band. The first amplified signals have a first gain, whereas the second amplified signals have a second gain. The first gain is more than the second gain.

Additional objects, advantages and novel features of the invention are set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

BRIEF SUMMARY OF THE DRAWINGS

The accompanying drawings, which are incorporated in and form a part of the specification, illustrate an exemplary embodiment of the present invention and, together with the description, serve to explain the principles of the invention. In the drawings.

DETAILED DESCRIPTION

The International Maritime Organization (IMO) requires designated commercial (and other) vessels to carry and use Automatic Identification System (AIS) transponder/receiver sets to broadcast critical own-ship data for the purpose of providing safety of ship situational awareness to all vessels transiting in a given area. For example, vessels carrying a Class A AIS unit broadcast the following information every 2 to 10 seconds while underway (less often while at anchor): a unique MMSI ID number, navigation status, latitude and longitude coordinates (to 1/10000 minute), position accuracy, rate of turn, course and speed over ground, true heading, and UTC time stamp. More descriptive ship data (e.g., vessel call sign, cargo, ship type, etc.) is transmitted every 6 minutes. Vessels in the area equipped with AIS hardware can receive this data, transmitted at a frequency of approximately 162 MHz, from other ships in their area and display it on an electronic geographic display or Geographic Information System (GIS) display that resembles a "bird's eye view" radar plot.

In accordance with an aspect of the present invention, a submerged submersible vehicle can access AIS data transmitted by vessels in the area by any known manner, non-limiting examples of which include by way of a buoy or BCA. The submerged submersible vehicle will effectively have access to an "artificial" constellation of GPS "satellite" since the exact GPS position of each vessel (or "satellite") is known with certainty.

The submerged submersible vehicle may then determine the bearing of each vessel by any known manner, a non-limiting example of which includes sonar. For example, assuming the submerged submersible vehicle's sonar operators can correlate these vessels with a specific sonar contact, for example by using standard submersible vehicle sonar classification techniques, the bearing to each vessel can be determined. If bearings of at least two correlated sonar contacts are available, the calculated geodetic position, which is based on the bearings to the vessels and their geodetic position, and which is where the sonar bearings cross, is the submerged submersible vehicle's real-time position. If AIS information for only one vessel is known and that information can be correlated to real-time sonar bearings, it is possible to use standard submersible vehicle target motion analysis (TMA) equations and techniques, along with own-ship speed and course data, to calculate the submerged submersible vehicle's position.

Figure 1A:
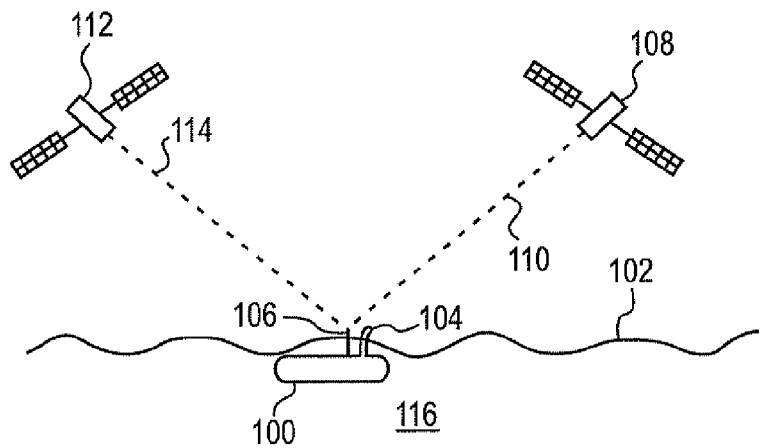
FIG. 1A illustrates a conventional method in which a submersible vehicle is able to determine its location using a GPS.
Figure 1B:
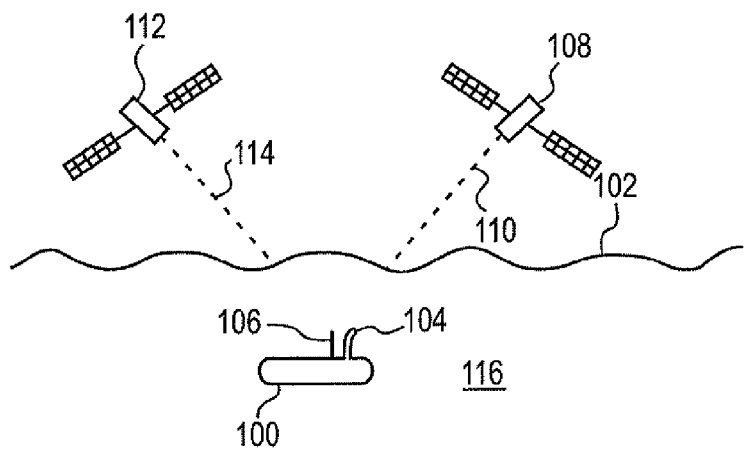
FIG. 1B illustrates when a submersible vehicle is below a periscope depth and is not able to determine its location using a GPS.
Figure 2:
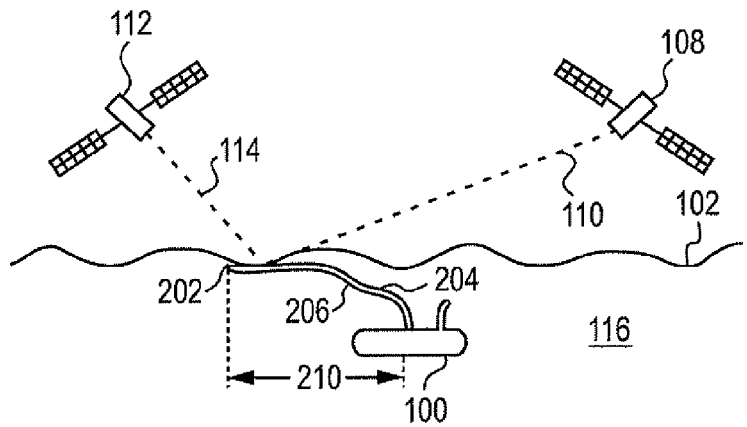
FIG. 2 illustrates a conventional method for a submersible vehicle to determine its location using a GPS and a BCA.

The benefit of the system and method of the present invention over conventional position fix taking techniques discussed above with reference to FIGS. 1A-2 is that the calculated position for the submerged submersible vehicle is independent of the position of the sensor used to collect the AIS information, and is available while submerged. Moreover, the submerged submersible vehicle can continue to calculate GPS-level fix positions for itself as long as the submersible vehicle receives valid AIS data from vessels in the area and the sonar bearings to those vessels are known.

Conventional submersible vehicle antenna/amplifier subsystems are not capable of conveying received AIS signals to a submersible vehicle in a manner in which the receiving equipment can process it correctly. In accordance with another aspect of the present invention, an inline amplifier increases the amplification of the frequency band for AIS while retaining the conventional gain of all other frequency bands that are not AIS.

Example embodiments of an aspect of the present invention will now be described with reference to FIGS. 4-7.

Figure 4:
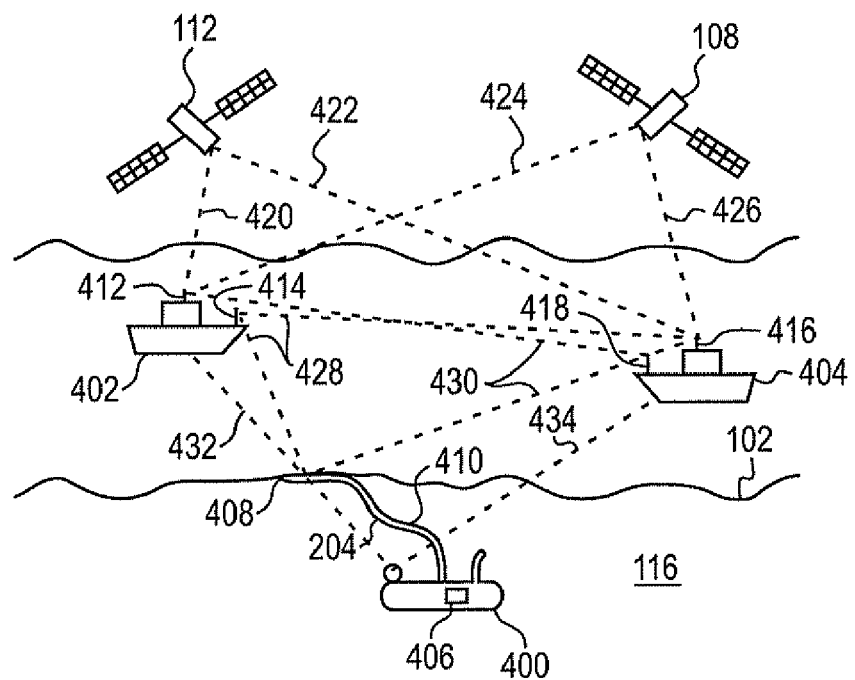
FIG. 4 illustrates a submerged submersible vehicle that is able to accurately determine its location in accordance with an aspect of the present invention.

FIG. 4 illustrates a submerged submersible vehicle that is able to accurately determine its location in accordance with an aspect of the present invention.

As illustrated in FIG. 4: submerged submersible vehicle 400 is under sea surface 102; a ship 402 and a ship 404 are at sea surface 102; and GPS satellite 108 and GPS satellite 112 are in orbit above ship 402 and ship 404. Submerged submersible vehicle 400 includes a BCA 408, a processing system 406 and a sonar system 409. BCA 408 includes a transmission cable portion 204 and an inline amplifier 410. Ship 402 includes an antenna 412 and an antenna 414, whereas ship 404 includes an antenna 416 and an antenna 418.

GPS satellite 108 transmits radio signal 424. GPS satellite 112 transmits radio signal 420.

Ship 402 receives radio signal 424 and radio signal 420 via antenna 412. Ship 402 is then able to determine its position on Earth by standard GPS techniques. This process occurs approximately once per second, so ship 402 constantly knows its real-time geodetic position. Ship 402 broadcasts its position, velocity and course information formatted for AIS via radio signal 428 through antenna 414, every 2-10 seconds as scheduled by AIS network.

Ship 404 receives radio signal 424 and radio signal 420 via antenna 416. Ship 404 is then able to determine its position on Earth by standard GPS techniques Ship 404 broadcasts its position, course and velocity information formatted for AIS via radio signal 430 through antenna 418 every 2-10 seconds as scheduled by AIS network.

Ship 402 receives radio signal 430 formatted for AIS and is able to determine the location, velocity and course of ship 404. Similarly, ship 404 receives radio signal 428 formatted for AIS and is able to determine the location, velocity and course of ship 402.

Sonar system 409 is operable to acoustically locate targets relative to submerged submersible vehicle 400. BCA 408 is operable to receive radio signal 428 from ship 402 and to receive radio signal 430 from ship 404. Processing system 406 is operable to process information retrieved with sonar system 409, radio signal 428 and radio signal 430 to accurately determine the location of submerged submersible vehicle 400, as will now be described in greater detail.

Noise from ship 402, such as produced by the engine and/or propeller, produces a sound wave 432. Using sonar system 409, submerged submersible vehicle 400 detects the presence and bearing of ship 402 with sound wave 432. Noise from ship 404, such as produced by the engine and/or propeller, produces a sound wave 434. Using sonar system 409, submerged submersible vehicle 400 detects the presence and bearing of ship 404 with sound wave 434.

Processing system 406 uses the bearing developed from the sonar information from sound wave 432 that was received by sonar system 409 in conjunction with position information of ship 402 received in the AIS information in radio signal 428 that was received by BCA 408 to determine a geodetic line of position of submerged submersible vehicle 400. Processing system 406 uses the bearing developed from the sonar information from sound wave 434 that was received by sonar system 409, in conjunction with position information of ship 404 received in the AIS information in radio signal 430, which was received by BCA 408, to additionally determine a second geodetic line of position of submerged submersible vehicle 400.

Using the combined sonar and AIS information received and for ship 402 and ship 404, submerged submersible vehicle 400 is able to accurately determine its own location as the intersection of the two (or more) geodetic lines of position. In accordance with this aspect of the present invention, the distance between the end of BCA 408 and submerged submersible vehicle 400, as denoted by separation 436, is not a detracting factor as is the case in the conventional system discussed above with respect to FIG. 2. In particular, in accordance with this aspect of the present invention, the location of BCA 408 with respect to submerged submersible vehicle 400 is not a relevant factor because it has no relation to the sonar information received by sonar system 409 from sound wave 432 and from sound wave 434. Further, the location of BCA 408 with respect to submerged submersible vehicle 400 is not a relevant factor because it does not affect reception of the AIS information in radio signal 428 and the AIS information in radio signal 430. The sonar information received from sound wave 432, the sonar information received from sound wave 434, the AIS information in radio signal 428 and the AIS information in radio signal 430 will be the same regardless of the location of BCA 408 with respect to submerged submersible vehicle 400.

Figure 5:
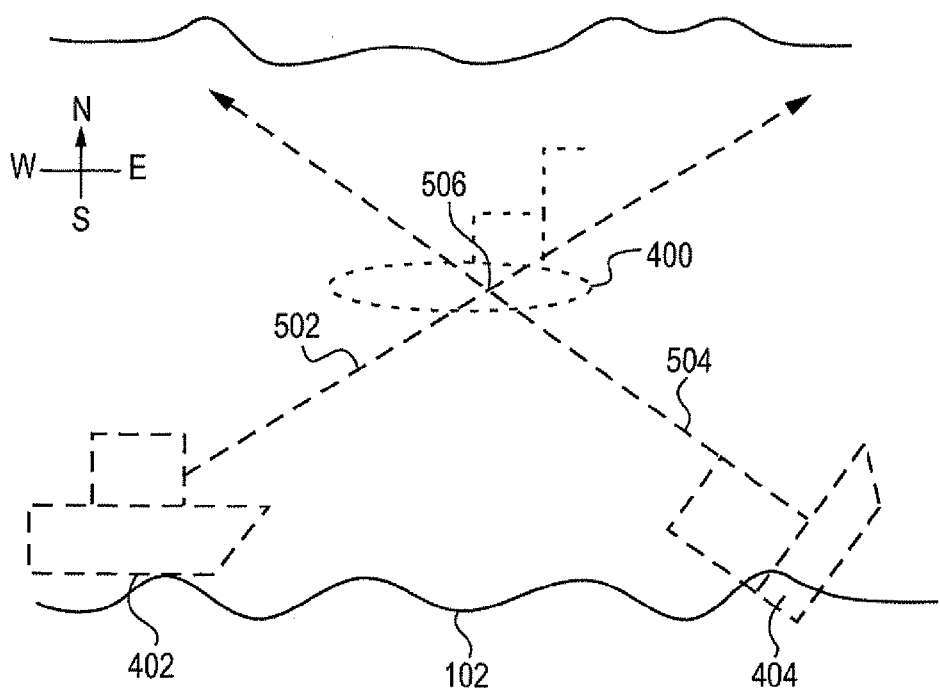
FIG. 5 is an overhead view of an area having a submerged submersible vehicle and two ships.

FIG. 5 is an overhead view of an area having submerged submersible vehicle 400, ship 402 and ship 404.

As described previously with respect to FIG. 4, submerged submersible vehicle 400 is able to receive AIS information broadcast by ship 402 and ship 404. Accordingly, submerged submersible vehicle 400 will know location, course and velocity of each of ship 402 and ship 404. Using the sonar information for ship 402, submerged submersible vehicle 400 is able to determine a bearing 502 of ship 402 relative to submerged submersible vehicle 400. Using the sonar information for ship 404, submerged submersible vehicle 400 is able to determine a bearing 504 of ship 404 relative to submerged submersible vehicle 400. The location of submerged submersible vehicle 400 is at a point 506, where bearing 502 and bearing 504 intersect.

There may be situations in which a submerged submersible vehicle may only receive AIS information that is broadcast from a single ship. In such cases, the submerged submersible vehicle will be unable to accurately determine its position using the example method discussed above with reference to FIG. 5. Another example method for calculating the location of a submersible vehicle using the sonar and AIS information from a single ship in accordance with an aspect of the present invention will now be described with reference to FIG. 6.

Figure 6:
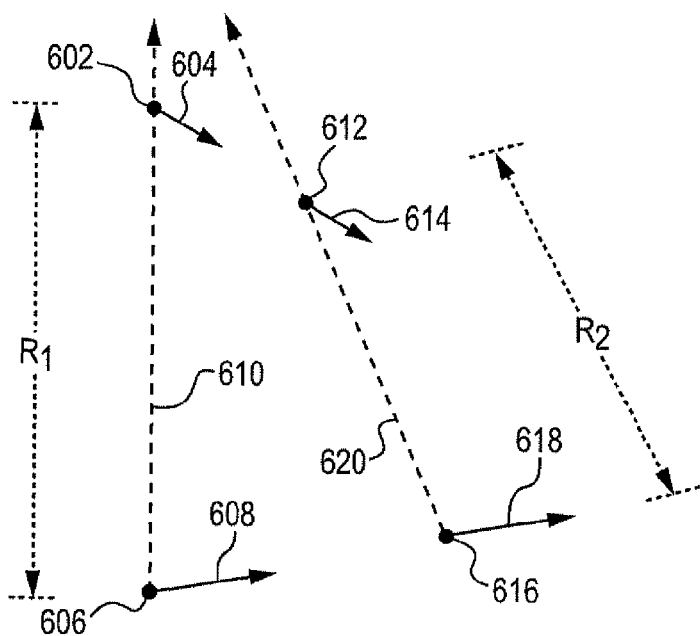
FIG. 6 illustrates example relative positions of a submerged submersible vehicle and a ship.

FIG. 6 illustrates example relative positions of a submerged submersible vehicle and a ship.

As illustrated in the figure: point 602 represents the latitude and longitude location of a ship at a first time $T_1$; point 606 represents the latitude and longitude location of a submerged submersible vehicle at time $T_1$; point 612 represents the latitude and longitude location of the ship at a second time $T_2$; and point 616 represents the latitude and longitude location of the submerged submersible vehicle at time $T_2$. At time $T_1$, the ship at point 602 is separated from the submerged submersible vehicle at point 606 by a range $R_1$. At time $T_2$, the ship at point 612 is separated from the submerged submersible vehicle at point 616 by a range $R_2$. At time $T_1$, the ship at point 602 is traveling at a velocity and course $V_{ship1}$ indicated by arrow 604, whereas the submerged submersible vehicle at point 606 is traveling at a velocity and course $V_{sub1}$ indicated by arrow 608. Similarly, at time $T_2$, the ship at point 612 is traveling at a velocity and course $V_{ship2}$ indicated by arrow 614, whereas the submerged submersible vehicle at point 616 is traveling at a velocity and course $V_{sub2}$ indicated by arrow 618. Dotted line 610 represents the bearing $B_1$, measured in degrees, of the ship from the submerged submersible vehicle at time $T_1$, whereas dotted line 620 represents the bearing $B_2$ of the ship from the submerged submersible vehicle at time $T_2$.

The ship will broadcast its position, velocity and course in accordance with AIS protocol. In accordance with an aspect of the present invention, the submersible vehicle will then know: point 602, i.e., the latitude and longitude location of the ship at time $T_1$; point 612, i.e., the latitude and longitude location of the ship at a second time $T_2$; the velocity and course of the ship at $T_1$, i.e., $V_{ship1}$ indicated by arrow 604; and the velocity and course of the ship at $T_2$, i.e., $V_{ship2}$ indicated by arrow 614. Further, by using a sonar system, the submersible vehicle may determine: the bearing $B_1$ of the ship from the submerged submersible vehicle at time $T_1$, i.e., dotted line 610; and the bearing $B_2$ of the ship from the submerged submersible vehicle at time $T_2$, i.e., dotted line 620. In accordance with an aspect of the present invention, the submerged submersible vehicle may accurately determine its own location using the known parameters $V_{ship1}$, $V_{ship2}$, and latitude and longitude location 612 of the ship at time $T_2$, and the determined parameters $B_1$ and $B_2$.

A change in the bearing $\Delta B$ is calculated as:

$$\Delta B = (B_2 - B_1)/(T_2 - T_1) \qquad (2)$$

Range $R_2$ can be calculated as:

$$R_2 = k\psi/\Delta B, \qquad (3)$$

where k is a constant 1,934 when range $R_2$ is measured in yards and is a constant 1 when range $R_2$ measured in nautical miles, and where $\psi$ is the relative speed of the ship (in knots) as compared to the submerged submersible vehicle across bearing $B_2$. With reference to FIG. 6, the component of $V_{ship2}$ that is perpendicular to bearing $B_2$ is subtracted from the component of $V_{sub2}$ that is perpendicular to bearing $B_2$ to determine $\psi$.

Using $B_2$ and $B_1$ as determined at times $T_2$ and $T_1$, respectively, for example as determined using a sonar system in accordance with the present invention, the submerged submersible vehicle may calculate the change in the bearing $\Delta B$ using equation (2) above.

Then, using $V_{ship2}$, as provided in the AIS information broadcast from the ship at time $T_2$, the submerged submersible vehicle may calculate the component of $V_{ship2}$ that is perpendicular to bearing $B_2$. Then, using the known velocity and course of the submersible vehicle $V_{sub2}$, at time $T_2$, the submerged submersible vehicle may calculate the component of $V_{sub2}$ that is perpendicular to bearing $B_2$. At this point, the submerged submersible vehicle may determine $\psi$. The submerged submersible vehicle may then calculate range $R_2$ using equation (3).

There may be instances where $B_1$ is very close to $B_2$, such as for example if the ship and the submerged submersible vehicle are traveling at the same velocity and course perpendicular to bearing $B_1$ and $B_2$. In such a case, using equation (2), the change in bearing $\Delta B$ approaches or equals zero. In such a case, $R_2$ will approach infinity using equation (3). To prevent such unusable data, the submerged submersible vehicle may alter its course such that it will not have the same velocity and course perpendicular to bearing $B_1$ and $B_2$ as the ship. This will create a change in bearing $\Delta B$ that increases from zero, thus providing usable data.

Location 612 of the ship at time $T_2$ is known by the submerged submersible vehicle from received AIS information; bearing $B_2$, represented by dashed arrow 620, has been determined by the submerged submersible vehicle using sonar;

and range $R_2$ has been calculated by the submerged submersible vehicle using equation (3). The submerged submersible vehicle may then accurately determine its own location 616 as a point at a distance $R_2$ in the direction reciprocal to $B_2$ ($B_2 \pm 180°$) from the geodetic location of the ship at time $T_2$ 612.

An example method for calculating the location of a submersible vehicle using sonar and AIS information in accordance with an aspect of the present invention will now be described with reference to FIG. 7.

Figure 7:
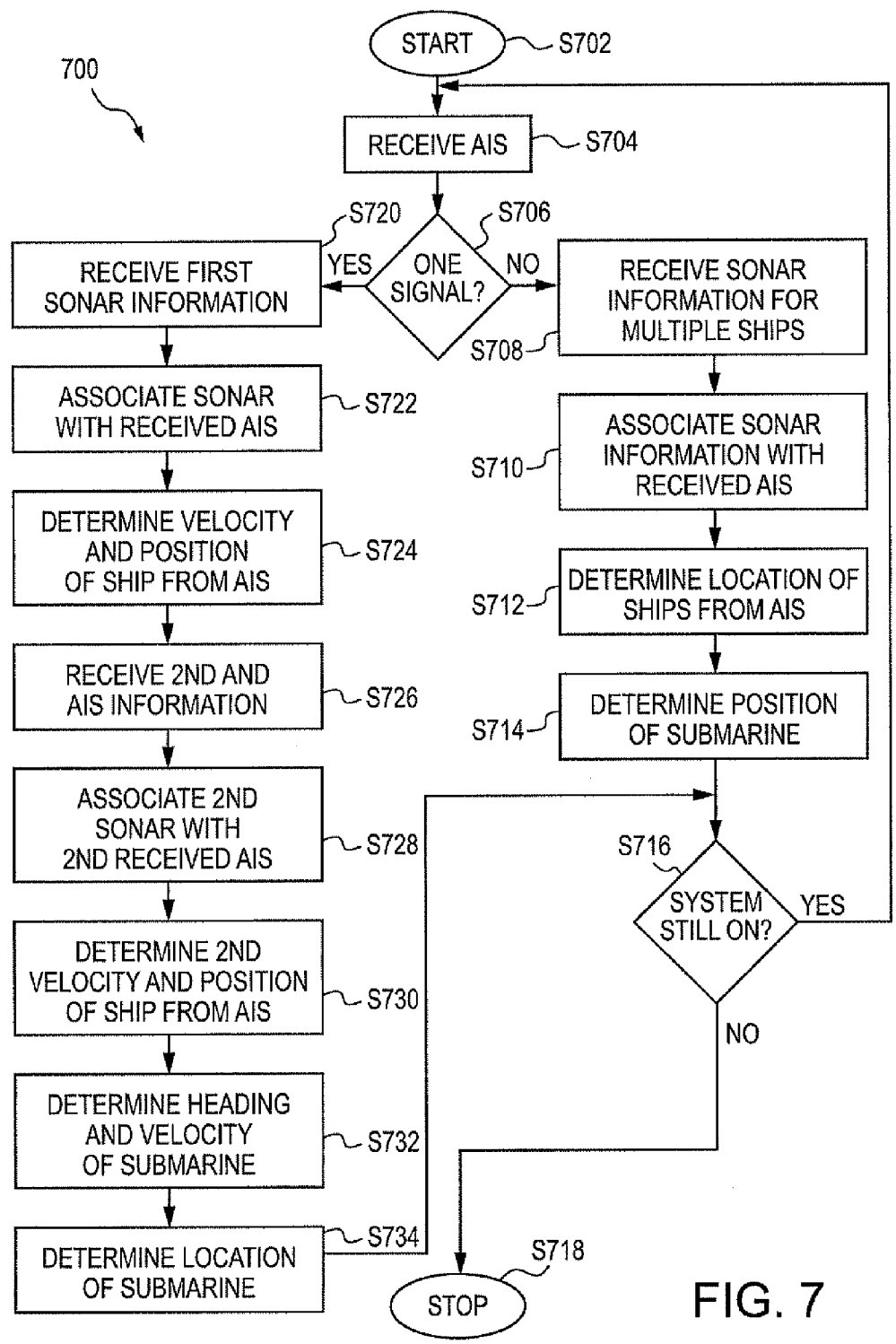
FIG. 7 is a flow chart describing an example method of determining a submerged submersible vehicle's location in accordance with aspects of the present invention.

FIG. 7 is a flow chart describing an example method 700 of determining a submerged submersible vehicle's location in accordance with aspects of the present invention.

As illustrated in the figure, method 700 starts (S702) and the submerged submersible vehicle receives AIS information from nearby ship(s) (S704). As discussed for example with reference to FIG. 4, BCA 408 receives AIS information within radio signal 428 from ship 402 and radio signal 430 from ship 404.

It is then determined whether AIS information was received from a single ship or multiple ships (S706).

In the case where AIS information is received from multiple ships, then the submerged submersible vehicle retrieves sonar information for each ship (S708). As discussed for example with reference to FIG. 4, sonar system 409 receives sound wave 432 from ship 402 and sound wave 434 from ship 404 and generates sonar information related ship 402 and ship 404, respectively.

At this point, submerged submersible vehicle associates the sonar information with the received AIS information (S710). As discussed for example with reference to FIG. 4, the AIS information within radio signal 428 includes the location, velocity and course of ship 402 and the AIS information within radio signal 430 includes the location, velocity and course of ship 404. Processing system 406 compares the locations and velocities of ship 402 and 404 to distinguish which ship (and therefore which location) is associated with which sonar information.

The submersible vehicle then determines the location of the ships using the AIS information (S712). As discussed for example with reference to FIG. 4, the AIS information within radio signal 428 includes the location ship 402 and the AIS information within radio signal 430 includes the location ship 404. Having associated ship 402 with the sonar information of sound wave 432, processing system 406 can determine the submersible vehicle's 400 geodetic line of position associated with ship 402. Having associated ship 404 with the sonar information of sound wave 434, processing system 406 can determine the submersible vehicle's 400 geodetic line of position associated with ship 404.

The submersible vehicle then determines the location of itself (S714). Referring to FIG. 5, location 506 of the submerged submersible vehicle is at the intersection of line of position 502 from ship 402 and line of position 504 from ship 404. Processing system 406 now knows: bearing 504 from sonar information of sound wave 434; bearing 502 from sonar information of sound wave 432; the location of ship 402 from AIS information of radio wave 428; the location of ship 404 from AIS information of radio wave 430. Processing system 406 may then accurately determine location 506 of the submerged submersible vehicle.

It is then determined whether processing system 406 is still operating to determine the location of the submerged submersible vehicle (S716). If processing system 406 is not operating to determine the location of the submerged submersible vehicle, method 700 stops (S718). If processing system 406 is still operating to determine the location of the submerged submersible vehicle, then the submersible vehicle again receives AIS information (S704).

Returning to the determination as to whether the AIS information is received from multiple ships (S706), in the case where AIS information is received from a single ship, then the submerged submersible vehicle retrieves sonar information for the single ship (S720). As discussed for example with reference to FIG. 6, sonar system 409 receives a sound wave from a ship and generates sonar information related to the ship to identify bearing 610.

The AIS information is then associated with the determined bearing (S722). For example, processing system 406 may associate the location of point 602 with determined bearing 610.

Then the submerged submersible vehicle retrieves new sonar information and new AIS information for the single ship (S726). As discussed for example with reference to FIG. 6, at time $T_2$, the ship has moved to a second location at point 612, whereas the submerged submersible vehicle has moved to a second location at point 616. At time $T_2$, sonar system 409 receives a second sound wave from the ship and generates second sonar information related to the ship to identify bearing 620.

The location information within the AIS information is then associated with the new determined bearing (S728). For example, processing system 406 may associate the location of point 612 with determined bearing 620.

The new velocity, course and location of the ship is then determined (S730). The new velocity, course and location of the ship at point 612 is known from the newly received AIS information.

The new velocity and course of the submerged submersible vehicle is then determined (S732). The new velocity and course of the submerged submersible vehicle at point 616 is known by the submerged submersible vehicle.

The location of the submerged submersible vehicle is then determined (S734). As discussed above with reference to FIG. 6: location 612 of the ship at time $T_2$ is known by the submerged submersible vehicle as described in step S726; bearing $B_2$, represented by dashed arrow 620, has been determined by the submerged submersible vehicle using sonar as described in step S726; and range $R_2$ has been calculated by the submerged submersible vehicle using equation (3). The submerged submersible vehicle may then accurately determine its own location 616 as a point at a distance $R_2$ in the direction reciprocal to $B_2$ ($B_2 \pm 180°$) from the geodetic location of the ship at time $T_2$ 612.

It is then determined whether processing system 406 is still operating to determine the location of the submerged submersible vehicle (S716). If processing system 406 is not operating to determine the location of the submerged submersible vehicle, method 700 stops (S718). If processing system 406 is still operating to determine the location of the submerged submersible vehicle, then the submersible vehicle again receives AIS information (S704).

In accordance with an aspect of the present invention, a submerged submersible vehicle is able to determine its own location based on AIS information that is broadcast from a ship in conjunction with a bearing of the ship with reference to the submerged submersible vehicle. As such, the submerged submersible vehicle must be able to receive the AIS information that is broadcast from the ship.

Figure 3:
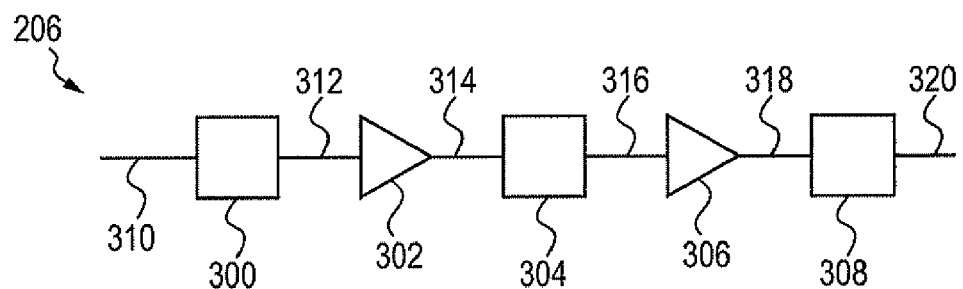
FIG. 3 illustrates an example conventional inline amplifier within a BCA.

The amplification and filtering provided by BCA 202 employing the conventional inline amplifier 206 discussed above with reference to FIG. 3, is not sufficient to overcome the losses of transmission cable portion 204 in order to enable received AIS signals to be processed by submersible vehicle 100. Submerged submersible vehicles use the BCA 202 to receive broadband signals in the VLF through VHF bands. An amplifier that amplifies only a band in the vicinity of AIS signals would eliminate the submersible vehicle's 100 ability to receive the other required broadband signals. Addition of another gain stage to conventional inline amplifier 206 would saturate the receiving equipment used for the other broadband signals. What is needed is an amplifier that provides a certain amount of gain to broadband signals and increased gain in a desired band (AIS in this embodiment). This will be discussed in greater detail below with reference to FIGS. 8A and 8B.

Figure 8A:
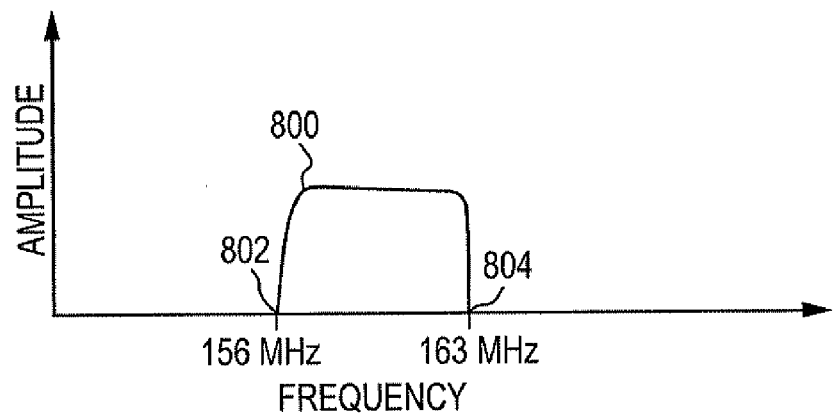
FIG. 8A is a graph of the AIS frequency band.

FIG. 8A is a graph of the band of desired signals, including AIS, wherein the y-axis is amplitude of the signal and the x-axis is the frequency of the signal.

As illustrated in the figure, desired RF band 800 is bounded by a lower frequency cutoff 802 and an upper frequency cutoff 804. RF band 800 is the frequency content of the signals transmitted by desired transmitters, including AIS. Lower frequency cutoff 802 is located at 156 MHz, whereas upper frequency cutoff 804 is located at 163 MHz.

Figure 8B:
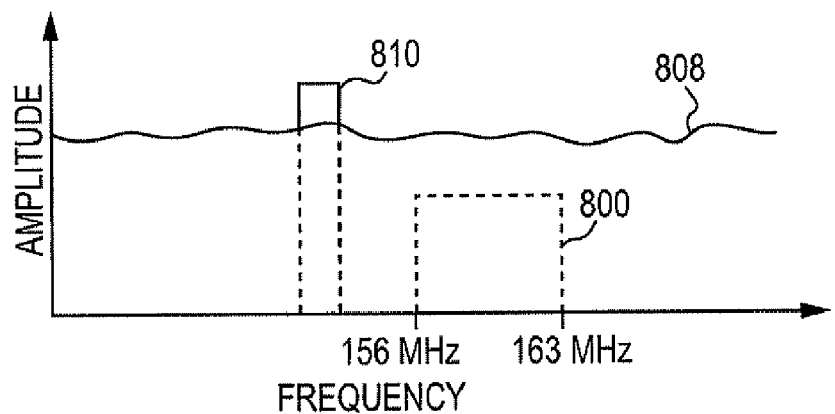
FIG. 8B is a graph of the band of signals that are receivable on BCA used by a submersible vehicle.
Figure 8C:
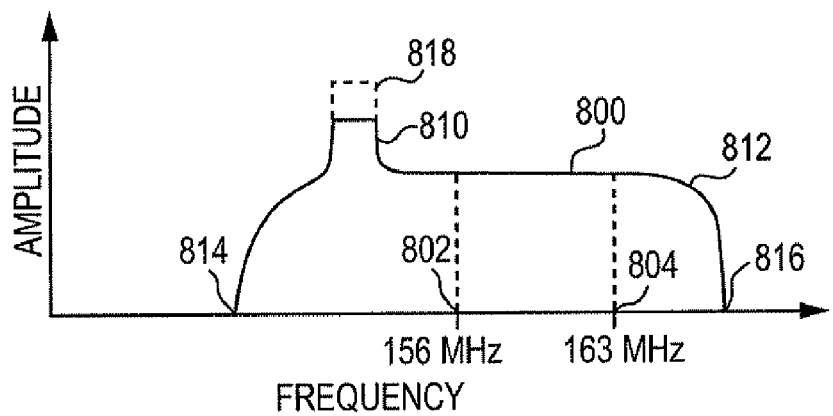
FIG. 8C is a graph of the band of signals that are receivable on a BCA used by a submersible vehicle after having been amplified with an inline amplifier having the transfer function of FIG. 10.
Figure 10:
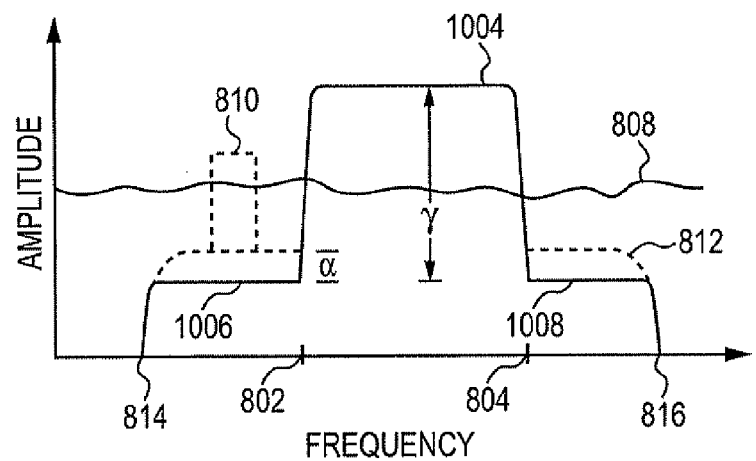
FIG. 10 is a transfer function of an example inline amplifier in accordance with an aspect of the present invention.

FIG. 8B is a graph of the band of signals received in the submersible vehicle via BCA 202, after having been amplified with the conventional inline amplifier 206, and transmitted via the transmission line 204, wherein the y-axis is amplitude of the received signal and the x-axis is the frequency of the received signal, and FIG. 8C is a graph of the band of signals that are receivable on a BCA used by a submersible vehicle after having been amplified with an inline amplifier having the transfer function of FIG. 10.

As illustrated in the figure, some signals within a band 810 have larger amplitudes than RF noise 808. Due to attenuation in the transmission line 204 higher frequency signals, including the desired band (AIS) are not above the RF noise. Accordingly, lower frequency signals within band 810 may be differentiated from RF noise 808 and may be processed. However, signals within desired RF band 800 are not above RF noise 808. Accordingly, signals within desired RF band 800 may not be differentiated from RF noise 808 and may not be processed.

RF noise is present at all frequencies and is amplified along with signals of interest at those frequencies. Adding more amplification to inline amplifier 206, as discussed above with reference to FIG. 2, would amplify all noise in received signal 310. This would overdrive inline amplifier 206 and overwhelm all signals of interest.

Figure 9:
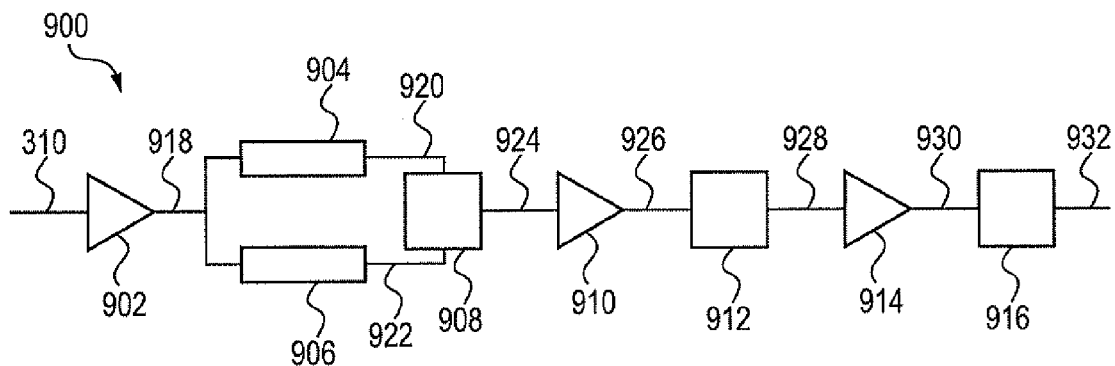
FIG. 9 illustrates an example inline amplifier in accordance with an aspect of the present invention.

FIG. 9 illustrates an example inline amplifier 900 in accordance with an aspect of the present invention.

As illustrated in the figure, inline amplifier 900 includes an amplifier 902, a bandpass filter 904, a broadband attenuator 906, a combiner 908, an amplifier 910, a gain compensation filter 912, an amplifier 914 and a bias tee 916.

Amplifier 902 is arranged to receive input signal 310 and to output an amplified signal 918. Bandpass filter 904 is arranged to receive amplified signal 918 and to output a filtered signal 920. Broadband attenuator 906 is arranged to receive amplified signal 918 and to output an attenuated signal 922. Combiner 908 is arranged to receive filtered signal 920 and attenuated signal 922 and to output a combined signal 924. Amplifier 910 is arranged to receive combined signal 924 and to output an amplified signal 926. Gain compensation filter 912 is arranged to receive amplified signal 926 and to output a filtered signal 928. Amplifier 914 is arranged to receive filtered signal 928 and to output an amplified signal 930. Bias tee 916 is arranged to receive amplified signal 930 and to output an output signal 932.

Inline amplifier 900 provides amplification of signals within the desired (AIS) band at greater amplification than other signals outside of the desired band in order to be able to allow processing and reception of AIS signals and still provide the required amplification to the other broadband signals. In operation, amplifier 902 amplifies input signal 310. In an example embodiment, amplifier 902 amplifies input signal 310 by 30 dB.

Bandpass filter 904 filters amplified signal 918 to pass only those signals within a band in the vicinity of AIS, approximately 156 MHz to 163 MHz. Broadband attenuator 906 concurrently attenuates amplified signal 918 to limit the amplified RF noise in the parts of the band that do not require the additional gain the desired band requires. In an example embodiment, broadband attenuator 906 attenuates amplified signal 918 by 33 dB.

Combiner 908 combines filtered signal 920 and attenuated signal 922. This provides a signal that is preferentially stronger in the band of interest (approximately 156-163 MHz). Amplifier 910 amplifies combined signal 924. In an example embodiment, amplifier 910 amplifies combines signal by 30 dB.

Gain compensation filter 912 compensates for signal attenuation characteristics of the transmission cable connected between output of inline amplifier 900 and the submersible vehicle. Gain compensation filter 912 has a transfer function that provides an incremental increase in amplification for signals within a band of 2 MHz up through the AIS band. This again limits the amplified RF noise in the (lower) parts of the band that do not require as much amplification to overcome transmission line losses.

Amplifier 914 amplifies filtered signal 928. In an example embodiment, amplifier 914 amplifies filtered signal 928 by 30 dB.

Bias tee 916 separates a DC bias 934 from the submersible vehicle from amplified signal 930 and provides it to the amplifiers. The total signal on the transmission line carrying output signal 932 comprises the combination of amplified signal 930 from inline amplifier 900 to the submersible vehicle 100 and a DC bias signal 934 from submersible vehicle 100 to inline amplifier 900.

FIG. 10 is a transfer function of an example inline amplifier in accordance with an aspect of the present invention.

As illustrated in FIG. 10, frequency band 1004 includes frequency band 800 (FIGS. 8A-8C) at preferentially higher gain. This enables the desired (AIS) band to be above the RF noise 808, and AIS signals may be processed.

Aspects in accordance with the present invention enable a submerged submersible vehicle to accurately determine its location using sonar and AIS information. In accordance with one aspect of the present invention, AIS information broadcast by nearby ships is used by a submerged submersible vehicle to determine the location, velocity and course of the ships. In one embodiment, AIS information received from at least two ships is used in conjunction with sonar information related to the ships to determine the submerged submersible vehicle's location. In another embodiment, AIS information and sonar information received from one ship at multiples times is used to determine the submerged submersible vehicle's location.

In accordance with another aspect of the present invention, an inline amplifier for use in a BCA enables a submersible vehicle to receive AIS signals broadcast from nearby ships. The amplification of the received signals overcomes the attenuation caused by the transmission cable connecting the amplifier to the submersible vehicle. The amplifier receives AIS signals along with other signals and noise. The signals located in the AIS frequency band are amplified more than other signals, and noise outside the AIS frequency band is attenuated. The selective amplification of the AIS frequency band amplifies the signals to a level at which they can be processed by AIS receiving equipment. The selective amplification of the AIS frequency band along with the lesser amplification of the other signals prevents the other signals from being amplified too much and saturating the receiving equipment used for processing the other signals, and allows the required amplification of all the signals by not overdriving the output stage of inline amplifier 900.

The example embodiments discussed above use a sonar system to determine a bearing of a ship with reference to the submersible vehicle. However, in accordance with aspects of the present invention, any known method of obtaining a bearing of a ship with reference to the submersible vehicle may be used.

The example embodiments discussed above use a BCA to retrieve AIS information to determine a ship's geodetic location. However, in accordance with aspects of the present invention, any known method of obtaining a geodetic location of a ship may be used.

The foregoing description of various preferred embodiments of the invention have been presented for purposes of illustration and description. It is not intended to be exhaustive or to limit the invention to the precise forms disclosed, and obviously many modifications and variations are possible in light of the above teaching. The exemplary embodiments, as described above, were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed as new and desired to be protected by Letters Patent of the United States is:

1. A method of determining a location of a submersible vehicle, said method comprising:
   obtaining first bearing information with a sonar system based on a location of a ship at a first time relative to the submersible vehicle;
   receiving broadcast information from the ship, the broadcast information including location information related to a second location of the ship at a second time, a velocity of the ship at the second time and a course of the ship at the second time;
   obtaining second bearing information based on the second location of the ship at the second time relative to the submersible vehicle;
   obtaining a velocity and a course of the submersible vehicle at the second time; and
   determining the location of the submersible vehicle based on the first bearing information, the second location of the ship at the second time, the velocity of the ship at the second time, the course of the ship at the second time, the second bearing information, the velocity of the submersible vehicle at the second time and the course of the submersible vehicle at the second time,
wherein said obtaining first bearing information with a sonar system comprises obtaining a first bearing of the ship with reference to the submersible vehicle,
wherein said obtaining second bearing information based on a location of a ship at a first time relative to the submersible vehicle comprises obtaining a second bearing of the ship with reference to the submersible vehicle,
wherein said determining the location of the submersible vehicle based on the first bearing information, the second location of the ship at the second time, the velocity of the ship at the second time, the course of the ship at the second time, the second bearing information, the velocity of the submersible vehicle at the second time and the course of the submersible vehicle at the second time comprises determining the velocity component of the velocity of the ship at the second time that is perpendicular to the second bearing of the ship with reference to the submersible vehicle and determining the velocity component of the velocity of the submersible vehicle at the second time that is perpendicular to the second bearing of the ship with reference to the submersible vehicle,
wherein change in bearing $\Delta B$ is calculated as $\Delta B=(B_2-B_1)/(T_2-T_1)$,
wherein $B_1$ is the first bearing of the ship with reference to the submersible vehicle,
wherein $B_2$ is the second bearing of the ship with reference to the submersible vehicle,
wherein $T_1$ is the first time,
wherein $T_2$ is the second time,
wherein $\psi$ is the difference between the velocity component of the velocity of the ship at the second time that is perpendicular to the second bearing of the ship with reference to the submersible vehicle and the velocity component of the velocity of the submersible vehicle at the second time that is perpendicular to the second bearing of the ship with reference to the submersible vehicle,
wherein said determining the location of the submersible vehicle based on the first bearing information, the second location of the ship at the second time, the velocity of the ship at the second time, the course of the ship at the second time, the second bearing information, the velocity of the submersible vehicle at the second time and the course of the submersible vehicle at the second time further comprises determining a range, R, of the ship from the submersible vehicle by calculating the equation $R_2=k\psi/\Delta B$, and
wherein k is a constant 1,934 when range $R_2$ is measured in yards and is a constant 1 when range $R_2$ measured in nautical miles.

* * * * *